(12) United States Patent
Shuang et al.

(10) Patent No.: US 10,142,763 B2
(45) Date of Patent: Nov. 27, 2018

(54) AUDIO SIGNAL PROCESSING

(71) Applicant: Dolby Laboratories Licensing Corporation, San Francisco, CA (US)

(72) Inventors: Zhiwei Shuang, Beijing (CN); David S. McGrath, Rose Bay (AU); Michael W. Mason, Wahroonga (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 15/039,695

(22) PCT Filed: Nov. 24, 2014

(86) PCT No.: PCT/US2014/067033
§ 371 (c)(1),
(2) Date: May 26, 2016

(87) PCT Pub. No.: WO2015/080994
PCT Pub. Date: Jun. 4, 2015

(65) Prior Publication Data
US 2017/0026771 A1    Jan. 26, 2017

Related U.S. Application Data

(60) Provisional application No. 61/993,970, filed on May 15, 2014, provisional application No. 61/914,097, filed on Dec. 10, 2013.

(30) Foreign Application Priority Data

Nov. 27, 2013 (CN) .......................... 2013 1 0629975
Apr. 28, 2014 (CN) .......................... 2014 1 0185954

(51) Int. Cl.
*H04S 7/00* (2006.01)
*H03G 9/02* (2006.01)

(52) U.S. Cl.
CPC ............. *H04S 7/307* (2013.01); *H03G 9/025* (2013.01); *H04S 7/306* (2013.01); *H04S 2420/01* (2013.01); *H04S 2420/07* (2013.01)

(58) Field of Classification Search
CPC . H04S 3/008; H04S 7/30; H04S 7/302; H04S 7/303; H04S 7/304; H04S 7/306;
(Continued)

(56) References Cited

U.S. PATENT DOCUMENTS 5,511,128 A * 4/1996 Lindemann .......... H04R 25/552
381/356
6,421,697 B1 7/2002 McGrath
(Continued)

FOREIGN PATENT DOCUMENTS

CN           1402593        3/2003
CN      104853283 A  *   8/2015   .............. H04R 3/00
(Continued)

OTHER PUBLICATIONS

Geiger, R. et al "Integer Low Delay and MDCT Filter Banks" IEEE Conference Record of the Thirty-Sixth Asilomar Conference on Signals, Systems and Computers, Nov. 3-6, 2002, vol. 1, pp. 811-815.
(Continued)

*Primary Examiner* — Yogeshkumar Patel
(74) *Attorney, Agent, or Firm* — Roger S. Sampson; Weaver Austin Villeneuve & Sampson LLP

(57) ABSTRACT

Embodiments of the present invention relate to audio signal processing. Specifically, a method for processing audio signal is provided, the method comprising: determining, for a current frame of the audio signal, frequency band energies for a plurality of predefined frequency bands at least partially based on frequency parameters of the current frame; generating frequency band gains for the plurality of pre-
(Continued)

defined frequency bands by processing the frequency band energies; and generating frequency bin gains for the current frame based on the frequency band gains using predefined frequency band filter banks, the frequency band filter banks being specific to the plurality of predefined frequency bands. Corresponding system and computer program product are also disclosed.

31 Claims, 6 Drawing Sheets

(58) Field of Classification Search
CPC .. H04S 7/307; H04S 2420/01; H04S 2420/07; H03G 9/025
USPC ................ 704/500; 381/17, 56, 94.3, 103, 2
See application file for complete search history.

(56) References Cited

U.S. PATENT DOCUMENTS

| | | | |
|---|---|---|---|
| 6,741,706 B1 | 5/2004 | McGrath | |
| 6,990,205 B1 | 1/2006 | Chen | |
| 7,006,636 B2 | 2/2006 | Baumgarte | |
| 7,099,482 B1 | 8/2006 | Jot | |
| 7,330,812 B2 * | 2/2008 | Ding | G10L 19/018 370/352 |
| 7,345,600 B1 | 3/2008 | Fedigan | |
| 7,835,535 B1 * | 11/2010 | Trautmann | H04S 1/005 381/1 |
| 7,912,225 B2 | 3/2011 | Chen | |
| 7,936,887 B2 | 5/2011 | Smyth | |
| 8,175,280 B2 | 5/2012 | Villemoes | |
| 8,457,975 B2 | 6/2013 | Neuendorf | |
| 8,477,970 B2 | 7/2013 | Strub | |
| 8,848,925 B2 * | 9/2014 | Tammi | G10L 19/008 381/17 |
| 9,426,589 B2 * | 8/2016 | Udesen | H04R 25/70 |
| 9,602,947 B2 * | 3/2017 | Oh | H04S 7/303 |
| 9,769,589 B2 * | 9/2017 | Umminger | H04S 7/304 |
| 9,961,469 B2 * | 5/2018 | Lee | H04S 5/005 |
| 2003/0179891 A1 * | 9/2003 | Rabinowitz | H04S 7/307 381/103 |
| 2005/0265535 A1 * | 12/2005 | Kanada | H04M 3/567 379/202.01 |
| 2006/0008117 A1 * | 1/2006 | Kanada | H04S 7/302 382/103 |
| 2007/0160219 A1 | 7/2007 | Jakka | |
| 2007/0174050 A1 * | 7/2007 | Li | G10L 21/02 704/208 |
| 2007/0270988 A1 * | 11/2007 | Goldstein | H04R 5/04 700/94 |
| 2008/0025519 A1 | 1/2008 | Yu | |
| 2008/0279318 A1 * | 11/2008 | Bharitkar | H04R 3/04 375/350 |
| 2009/0028344 A1 | 1/2009 | Pang | |
| 2009/0046864 A1 * | 2/2009 | Mahabub | H04S 7/30 381/17 |
| 2009/0067644 A1 * | 3/2009 | Crockett | H04S 7/00 381/98 |
| 2009/0103738 A1 * | 4/2009 | Faure | H04S 1/005 381/17 |
| 2009/0220105 A1 | 9/2009 | Bachmann | |
| 2009/0225980 A1 * | 9/2009 | Schmidt | H04M 9/082 379/406.02 |
| 2009/0232317 A1 | 9/2009 | Emerit | |
| 2009/0262969 A1 * | 10/2009 | Short | H04R 3/005 381/370 |
| 2009/0304190 A1 * | 12/2009 | Seefeldt | G10L 25/69 381/56 |
| 2010/0202632 A1 | 8/2010 | Seefeldt | |
| 2011/0026745 A1 * | 2/2011 | Said | H04S 1/002 381/310 |
| 2011/0081024 A1 * | 4/2011 | Soulodre | G01S 3/8006 381/17 |
| 2011/0081026 A1 * | 4/2011 | Ramakrishnan | G10L 21/0208 381/94.3 |
| 2011/0109798 A1 * | 5/2011 | McReynolds | H04S 7/30 348/485 |
| 2011/0145003 A1 * | 6/2011 | Bessette | G10L 19/0212 704/500 |
| 2011/0320209 A1 * | 12/2011 | Vickers | H03G 9/025 704/500 |
| 2011/0320210 A1 * | 12/2011 | Vickers | H03G 9/025 704/500 |
| 2012/0008806 A1 * | 1/2012 | Hess | H04R 1/023 381/302 |
| 2012/0051549 A1 * | 3/2012 | Nagel | G10L 19/025 381/56 |
| 2012/0099732 A1 * | 4/2012 | Visser | G10L 21/0272 381/17 |
| 2012/0201389 A1 | 8/2012 | Emerit | |
| 2012/0232912 A1 * | 9/2012 | Tammi | G10L 19/008 704/502 |
| 2012/0239385 A1 * | 9/2012 | Hersbach | G10L 25/84 704/200.1 |
| 2012/0288124 A1 * | 11/2012 | Fejzo | H04R 5/02 381/303 |
| 2013/0013321 A1 * | 1/2013 | Oh | G10L 21/038 704/500 |
| 2013/0051565 A1 * | 2/2013 | Pontoppidan | H04R 25/353 381/23.1 |
| 2013/0051566 A1 * | 2/2013 | Pontoppidan | H04R 25/353 381/23.1 |
| 2013/0051571 A1 * | 2/2013 | Nagel | G10L 19/0204 381/56 |
| 2013/0253939 A1 * | 9/2013 | Tsutsumi | G10L 19/005 704/500 |
| 2013/0259238 A1 * | 10/2013 | Xiang | G06F 3/017 381/17 |
| 2013/0259254 A1 * | 10/2013 | Xiang | G10K 11/175 381/73.1 |
| 2014/0006017 A1 * | 1/2014 | Sen | G10L 21/003 704/208 |
| 2014/0126745 A1 * | 5/2014 | Dickins | H04R 3/002 381/94.3 |
| 2014/0142958 A1 * | 5/2014 | Sharma | G10L 19/018 704/500 |
| 2014/0153765 A1 * | 6/2014 | Gan | H04R 1/1075 381/374 |
| 2014/0198918 A1 * | 7/2014 | Li | H04S 7/30 381/26 |
| 2014/0211966 A1 * | 7/2014 | Hetherington | G10K 11/178 381/94.3 |
| 2014/0341388 A1 * | 11/2014 | Goldstein | H04R 1/1083 381/71.11 |
| 2015/0066175 A1 * | 3/2015 | Tremblay | H04S 7/307 700/94 |
| 2015/0092965 A1 * | 4/2015 | Umminger | H04S 7/304 381/310 |
| 2015/0248891 A1 * | 9/2015 | Adami | H04S 5/00 381/303 |
| 2015/0296319 A1 * | 10/2015 | Shenoy | H04S 7/302 381/303 |
| 2015/0350801 A1 * | 12/2015 | Koppens | H04S 1/005 381/1 |
| 2016/0020744 A1 * | 1/2016 | Kok | H03G 3/32 381/57 |
| 2016/0198281 A1 * | 7/2016 | Oh | H04S 3/00 381/310 |
| 2016/0323688 A1 * | 11/2016 | Lee | G10L 19/008 |
| 2017/0019746 A1 * | 1/2017 | Oh | H04S 3/008 |
| 2017/0188174 A1 * | 6/2017 | Lee | H04S 7/307 |
| 2017/0188175 A1 * | 6/2017 | Oh | H04S 7/307 |

FOREIGN PATENT DOCUMENTS

| | | |
|---|---|---|
| EP | 2002429 B1 * | 3/2007 |
| EP | 2002429 | 12/2008 |
| EP | 2002429 B1 * | 11/2012 |
| WO | 2005/064595 | 7/2005 |

(56) References Cited

FOREIGN PATENT DOCUMENTS

| WO | 2007/078254 | 7/2007 |
|---|---|---|
| WO | WO 2007/078254 A2 * | 7/2007 |
| WO | 2008/071353 | 6/2008 |
| WO | 2011/048118 | 4/2011 |
| WO | 2012/050705 | 4/2012 |
| WO | 2012/109385 | 8/2012 |

OTHER PUBLICATIONS

Muller-Tomfelde, Christian "Low-Latency Convolution for Real-Time Applications" AES 15th International Conference: Spatial Sound Reproduction, Mar. 1, 1999, pp. 454-460.

Wefers, F. et al "Potential of Non-Uniformly Partitioned Convolution with Freely Adaptable FFT Sizes" AES Convention, Signal Processing Fundamentals, Oct. 25, 2012, pp. 1-8.

Lecomte, J. et al "Efficient Cross-Fade Windows for Transitions Between LPC-Based and Non-LPC Based Audio Coding" AES 126th Convention,Munich, Germany, May 7-10, 2009, Audio Coding, pp. 1-9.

Lollmann, H.W. et al "Low Delay Filter-Banks for Speech and Audio Processing" Institute of Communications Systems and Data Processing, Germany, part of book called, "Speech and Audio Processing in Adverse Environments" pp. 13-61, 2008.

Xie, B. et al. "An Algorithm for Efficiently Synthesizing Multiple Near-Field Virtual Sources in Dynamic Virtual Auditory Display" AES Convention Paper 8646, presented at the 132nd Convention, Apr. 26-29, 2012, Budapest, Hungary, pp. 1-9.

Atkins, J. et al "Approximate Convolution Using Partitioned Truncated Singular Value Decomposition Filtering for Binaural Rendering" Jun. 2-7, 2013, Signal Processing in Acoustics, vol. 19, pp. 1-6.

Tenenbaum, R. et al "Hybrid Method for Numerical Simulation of Room Acoustics with Auralization: Part 1—Theoretical and Numerical Aspects" Journal of the Brazilian Society of Mechanical Sciences and Engineering, vol. 29, No. 2, Apr.-Jun. 2007, pp. 211-221.

* cited by examiner

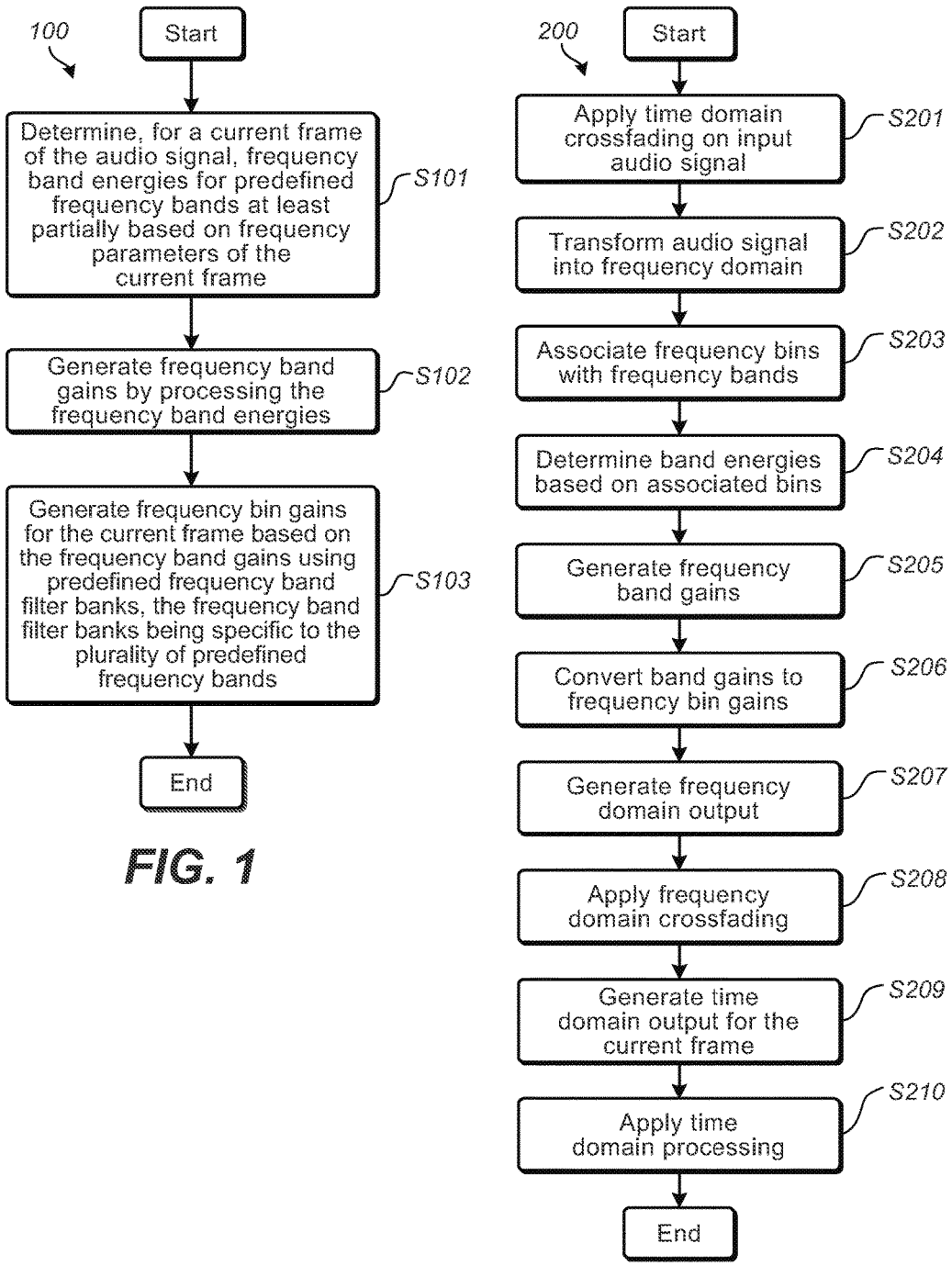

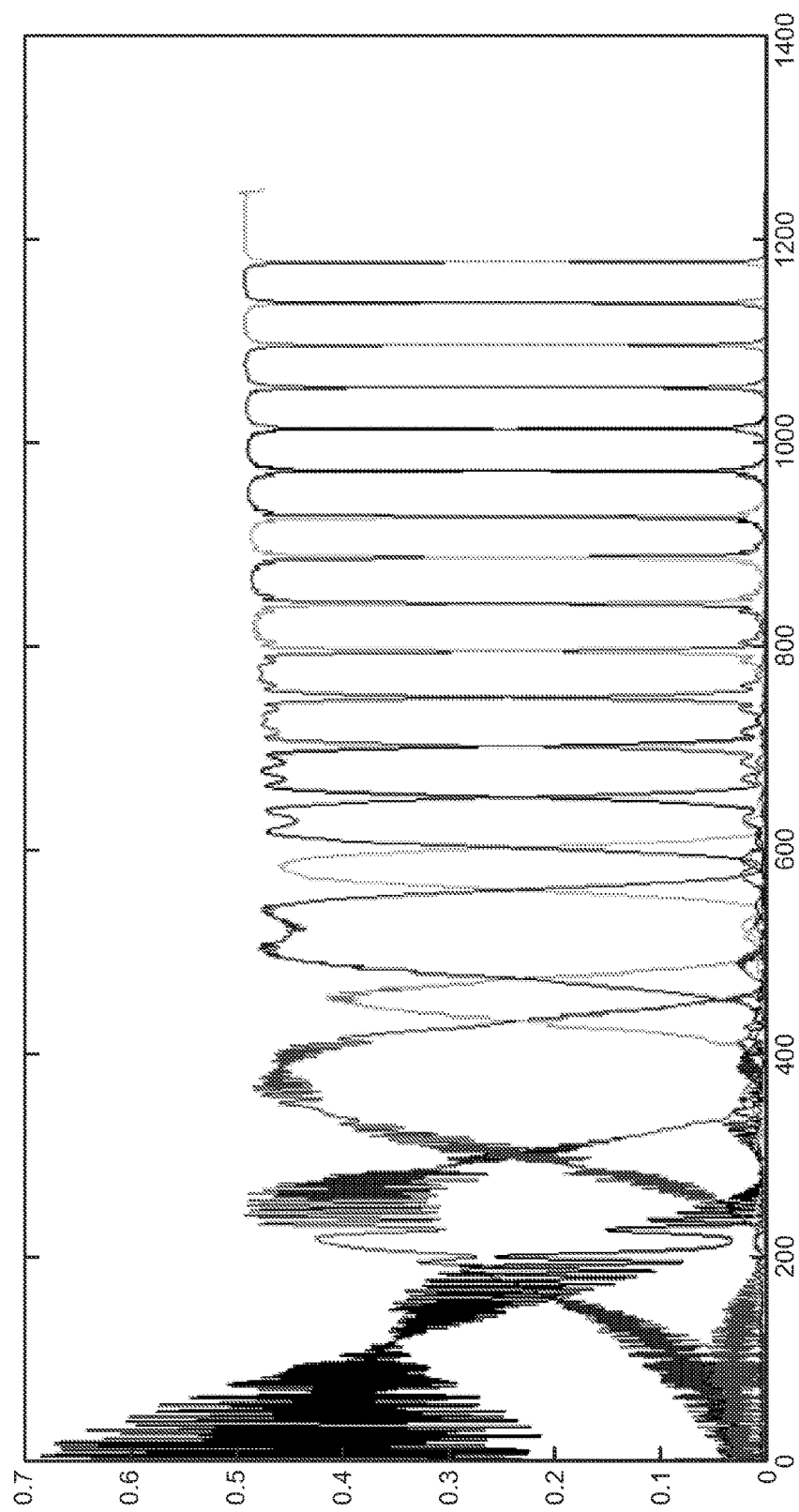

AUDIO SIGNAL PROCESSING

CROSS-REFERENCE TO RELATED APPLICATIONS

This application claims priority to Chinese Patent Application No. 201310629975.6 filed 27 Nov. 2013; Chinese Patent Application No. 201410185954.4 filed 28 Apr. 2014; U.S. Provisional Patent Application No. 61/993,970 filed 15 May 2014; and U.S. Provisional Patent Application No. 61/914,097 filed 10 Dec. 2013, each of which is hereby incorporated by reference in its entirety.

TECHNOLOGY

The present invention generally relates to audio signal processing, and more specifically, to a method and system for device specific audio single processing with low latency.

BACKGROUND

In order to play back audio signal with good quality, it is generally necessary to process the audio signal. For example, the audio signal may be processed according to the characteristics or parameters of the target playback device. Such processing is referred as device specific or centric audio signal processing. In general, the device specific audio signal processing involves anything related to presentation and calibration according to the playback device and/or environment. Typically the device specific audio signal processing may include equalizer processing, regulator processing, peak limiting processing, and so forth. As an example, if the playback device has a limited capacity of reproducing the high frequency component of the audio signal, then the audio signal can be processed to suppress the high frequency component accordingly to avoid any clicks, distortions or any other audible artifacts in the playback. Of course, it would be appreciated that the audio signals may be processed for any other purposes.

For some cases such as VoIP (Voice over Internet Protocol) communications and gaming, latency of the audio signal processing is a significant factor. Long latency of the audio signal processing is very likely to decrease the overall performance of the application and has negative impact on user experience. However, at present, solutions for audio signal processing usually cannot minimize the latency due to the consideration of fidelity. More specifically, the audio signal processing generally comprises transforms between time domain and frequency domain. For example, the audio signal may be transformed from the time domain to the frequency domain to obtain a series of frequency coefficients. The frequency coefficients can be modified according to the characteristics of the playback device. Then the audio signal with the modified coefficients is transformed back to the time domain for playback. There is a tradeoff between audio processing latency and computational efficiency. To achieve high resolution in the filter's frequency response, known approaches have to operate with high computational cost or significant latency. Moreover, in order to allow a fine level control of all frequency parameters, existing solutions usually introduce higher distortion or longer latency. However, in some audio processing such as device specific audio processing, it is only necessary to modify the band energy of a small number of bands to meet the quality requirement of most users.

In view of the foregoing, there is a need in the art for a solution for audio signal processing with low latency.

SUMMARY

In order to address the foregoing and other potential problems, the present invention proposes a method and system for processing audio signals.

In one aspect, embodiments of the present invention provide a method for processing audio signal. The method comprises: determining, for a current frame of the audio signal, frequency band energies for a plurality of predefined frequency bands at least partially based on frequency parameters of the current frame; generating frequency band gains for the plurality of predefined frequency bands by processing the frequency band energies; and generating frequency bin gains for the current frame based on the frequency band gains using predefined frequency band filter banks, the frequency band filter banks being specific to the plurality of predefined frequency bands. Embodiments in this regard further comprise a corresponding computer program product.

In another aspect, embodiments of the present invention provide a system for processing audio signal. The system comprises: a band energy determining unit configured to determine, for a current frame of the audio signal, frequency band energies for a plurality of predefined frequency bands at least partially based on frequency parameters of the current frame; a band gain generating unit configured to generate frequency band gains for the plurality of predefined frequency bands by processing the frequency band energies; and a bin gain generating unit configured to generate frequency bin gains for the current frame based on the frequency band gains using predefined frequency band filter banks, the frequency band filter banks being specific to the plurality of predefined frequency bands.

Through the following description, it would be appreciated that in accordance with embodiments of the present invention, the audio signal processing can be done by simply operating frequency band gains for a certain number of predefined frequency bands that are defined and fixed in advance according to, for example, human auditory characteristics or models. Since the frequency bands are fixed in advance, it is possible to reduce the latency in audio signal processing by using predefined frequency band filter banks to derive the frequency bin gains based on the frequency band gains. Other advantages achieved by embodiments of the present invention will become apparent through the following descriptions.

DESCRIPTION OF DRAWINGS

Through the following detailed description with reference to the accompanying drawings, the above and other objectives, features and advantages of embodiments of the present invention will become more comprehensible. In the drawings, several embodiments of the present invention will be illustrated in an example and non-limiting manner, wherein:

FIG. 1 illustrates a flowchart of a method for processing audio signal in accordance with an example embodiment of the present invention;

FIG. 2 illustrates a flowchart of a method for processing audio signal in accordance with another example embodiment of the present invention;

FIGS. 4A and 4B illustrate diagrams of the frequency band excitations of a log sweep signal in accordance with example embodiments of the present invention;

Throughout the drawings, the same or corresponding reference symbols refer to the same or corresponding parts.

DESCRIPTION OF EXAMPLE EMBODIMENTS

Figure 3:
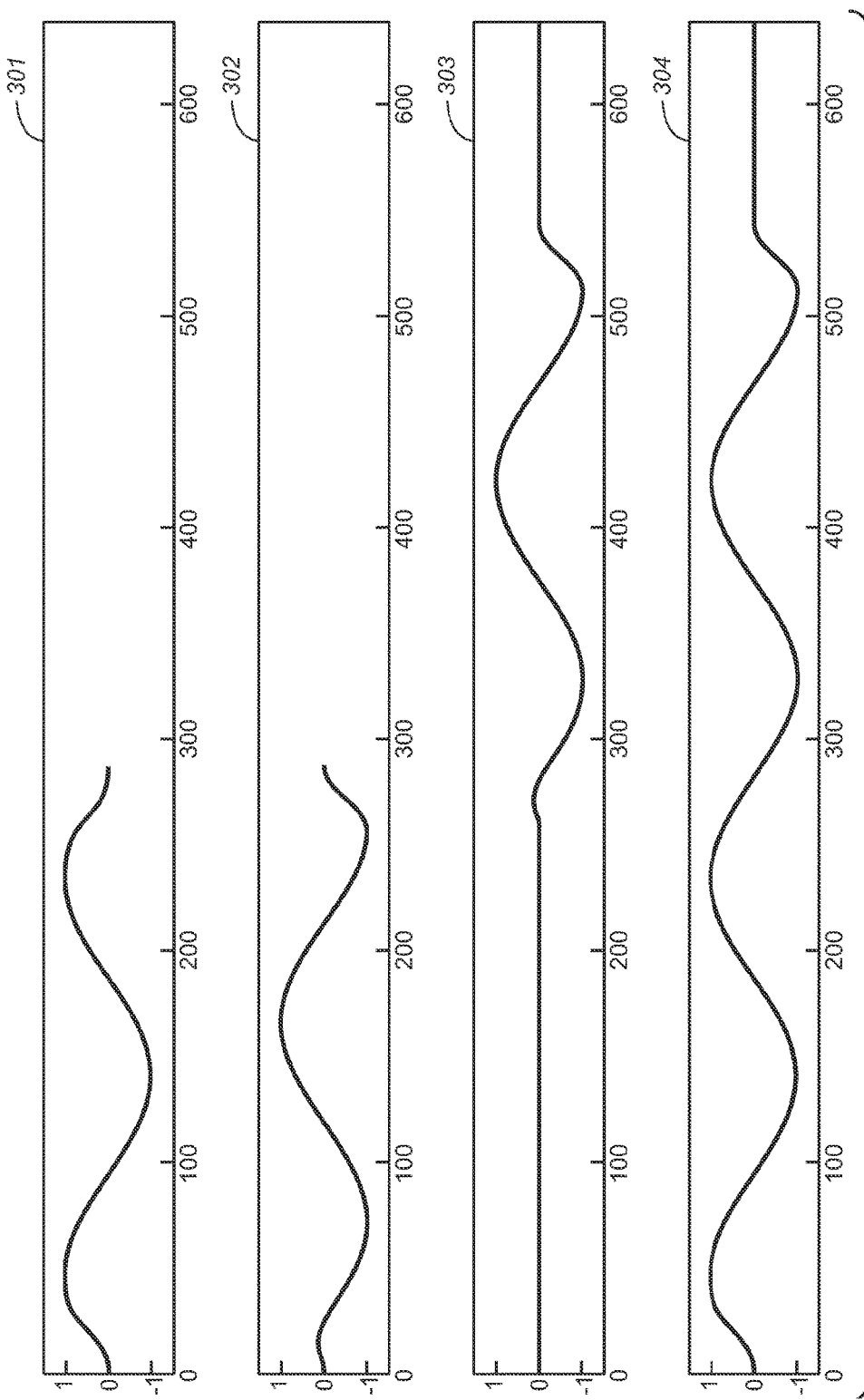
FIG. 3 illustrates diagrams of windowed signals in accordance with an example embodiment of the present invention.

Principles of the present invention will now be described with reference to various example embodiments illustrated in the drawings. It should be appreciated that depiction of these embodiments is only to enable those skilled in the art to better understand and further implement the present invention, not intended for limiting the scope of the present invention in any manner.

The basic idea of the present invention is to process the audio signal by controlling frequency band gains for a set of predefined frequency bands in the frequency domain. In accordance with embodiments of the present invention, the frequency bands to be operated may be defined and fixed in advance according to, for example, human auditory characteristics or models. Additionally, since the frequency bands are fixed in advance, it is possible to reduce the latency in audio signal processing by using of predefined frequency band filter banks to generate the frequency bin gains based on the frequency band gains. Moreover, due to the reduction of the frequency coefficients to be processed, the time cost associated with the time-frequency and frequency-time transforms will be significantly decreased.

Reference is first made to FIG. 1 which shows a flowchart of a method 100 for processing audio signal in accordance with example embodiments of the present invention.

At step S101, for a current frame or block of the audio signal to be processed, frequency band energies for a plurality of predefined frequency bands are determined at least partially based on frequency parameters of the current frame. In some embodiments, the audio signal may be input as a frequency domain signal. For example, the audio signal may be in the form of a series of frequency bins, each of which is represented as, for example, a complex. Alternatively, the input audio signal may be in the time domain and thus needs to be transformed into the frequency domain, which will be discussed in the following.

In accordance with embodiments of the present invention, the frequency bands may be defined in advance according to, for example, human auditory characteristics or models. For example, it is proved that the human users are sensitive to a certain range of frequency, for example, from 0 to 24 kHz. Accordingly, only the frequency bands within that range will be subject to the frequency domain processing. As such, embodiments of the present invention utilize a convenient, efficient simplification that conforms to the human hearing system to facilitate reducing the latency. For example, in some embodiments, the frequency range of 0-24 kHz may be divided into twenty frequency bands. It should be noted that this is only for the purpose of illustration and any other suitable frequency range and/or the number of bands can be used.

For each of the predefined frequency bands of the current frame, there may be associated frequency parameters. The frequency parameters may be obtained in various different manners. For example, in some embodiments as discussed above, the frequency domain audio signal may include a plurality of frequency bins, each of which is represented as a complex. In such embodiments, the real and imaginary parts of each complex may be used as the frequency parameters. Alternatively or additionally, the frequency parameters may be derived by any suitable frequency analysis or processing on the audio signal.

The frequency band energy for each frequency band may be determined based on the associated frequency parameters of the current frame. Given the frequency parameters, the frequency band energies may be calculated, for example, as the sum or sum of squares of the frequency parameters. Example embodiments in this regard will be detailed below.

Next, the method 100 proceeds to step S102 where the frequency band energies are processed to generate frequency band gains for the predefined frequency bands. In accordance with embodiments of the present invention, processing of one or more frequency band energies may be done by any suitable frequency domain audio processing techniques, including but not limited to equalizer processing, regulator processing, peak limiting processing, and so forth. Accordingly, the equalizer, regulator, peak limiter or any other devices, no matter currently known or developed in the future, may be used in connection with embodiments of the present invention. Specifically, in some embodiments, in order to generate frequency band gains, the frequency band energies may be processed according to one or more parameters of a playback device for playing back the audio signal, thereby achieving the device specific audio signal processing. Lots of techniques for generating frequency band gains by processing frequency band energies are known and can be used in connection with embodiments of the present invention. The scope of the present invention is not limited in this regard.

Then, at step S103, frequency bin gains for the current frame are generated. In accordance with embodiments of the present invention, the frequency bin gains may be generated based on the frequency band gains using a plurality of predefined frequency band filter banks that are specific to the plurality of predefined frequency bands. For example, a filter bank may be designed for each of the predefined frequency bands. As described above, the frequency bands are predefined. Accordingly, the frequency band filter bank specific to each of the frequency bands can be also designed in advance. By applying such frequency band filter banks to the frequency band gains, a plurality of frequency bin gains in the form of filter coefficients may be obtained.

Given the frequency bin gains, frequency domain output for the current frame can be determined, for example, by multiplying the frequency bin gains by the respective frequency bins. Specifically, in some embodiments, the frequency domain output for the current frame may be determined merely based on the frequency bins for the current frame. In some alternative embodiments, the frequency domain output for the current frame may be determined based on the frequency bin gains not only for the current frame but also for at least one previous frame of the audio signal.

By implementing the method 100, embodiments of the present invention can process audio signals with less latency. Specifically, as mentioned above, it is required for those known solutions to obtain and process a large number of frequency coefficients to meet the quality requirement, which will result in a long latency in the transforms. To the contrary, in accordance with embodiments of the present invention, it is only necessary to control the frequency band gains for a certain number of predefined, fixed frequency bands. As a result, the time cost for time-frequency and frequency-time transforms will be significantly reduced. Moreover, the generated frequency band gains may be converted to the frequency bin gains by using the predefined frequency band filter banks that are specific to the predefined frequency bands. Since these frequency band filter banks can be designed according to the definition of the frequency bands, generation of the frequency bin gains and the frequency domain output can be quickly done.

FIG. 2 shows a flowchart of a method 200 for processing audio signal in accordance with exemplary embodiments of the present invention. It would be appreciated that the method 200 can be considered as a specific example embodiment of the method 100 as discussed above. Specifically, in the embodiment shown in FIG. 2, the audio signal to be processed is initially represented as time domain signal composed of a plurality of frames or blocks.

At step S201, a time domain crossfading process is applied on the audio signal. In accordance with embodiments of the present invention, the processing may be performed every S samples, where S is a natural number. In some embodiments, for each frame of the audio signal, $S+C_0$ samples may be obtained as input and S new audio output samples will be produced, where $C_0$ represents the length of crossfading. In this way, each output frame overlaps the preceding output frame by $C_0$ samples. In some implementation, there may be a buffer with a length of $S+C_0$ for storing the input samples. For each frame, S samples are obtained and appended into the end of the buffer, while the last $C_0$ samples of the previous frame is maintained in the buffer. In some embodiments, for example, it is possible to set S=256, $C_0$=32, and N=320. It should be noted that these values are only for the purpose of illustration and any other suitable values are possible.

The crossfading process at step S201 may be implemented in various different manners, no matter currently known or developed in the future. For example, a time domain crossfading window may be applied on the $S+C_0$ samples. In some embodiments, the crossfading window may be designed as follows:

$$win(n) = \begin{cases} \sin\left(\frac{n}{C_0+1} * \frac{\pi}{2}\right)^2, & 1 \leq n \leq C_0 \\ 1, & C_0+1 \leq n \leq S \\ \cos\left(\frac{n-S}{C_0+1} * \frac{\pi}{2}\right)^2 & n = S+1:S+C_0 \end{cases}$$

Any other suitable crossfading techniques can be used in connection with embodiments of the present invention. Applying time domain crossfading will facilitate reducing distortions when generating the frequency band gains with a very low computation cost.

Next, the method 200 proceeds to step S202, where the audio signal is transformed from the time domain to the frequency domain. The frequency domain signal for the current frame, which is assumed to be the pth frame of the audio signal, may be obtained by $$X_p(k) = F(x_p(n)),$$

where F( ) represents a time-frequency transform, and $x_p(n)$ represents the time domain samples for the pth frame which may be expressed as follows:

$$x_p(n) = \begin{cases} \text{input}(pS+n), & 0 < n < S+C_0 \\ 0, & S+C_0 < n < 2N \end{cases},$$

where input( ) represents the input value of the audio signal, and N represents the length of the time-frequency transform.

In some embodiments, for example, the transform F( ) may be a Modulated Discrete Fourier Transform (MDFT). In these embodiments, the frequency domain samples for the pth frame $X_p(k)$ are obtained by:

$$X_p(k) = MDFT(x_p(n)) = \sum_{n=0}^{2N-1} x_p(n) e^{-i\pi(2k+1)n/2N}.$$

Alternatively, the transform may be the standard Discrete Fourier Transform (DFT) or any other suitable time-frequency transform. The scope of the invention is not limited in this regard.

With the time-frequency transform, 2N real time domain samples may be transformed to N complex frequency domain samples, each of which can be considered as a frequency bin. Each frequency bin may be represented as a complex, and the real and imaginary parts of each complex may be used as the frequency parameters for the pth frame.

Then, at step S203, each of the plurality of predefined frequency bands is associated with at least one of the plurality of frequency bins obtained at step S202. In some embodiments, the obtained frequency bins may be allocated into different frequency bands, where each frequency band is associated one or more frequency bins. The association between the frequency bands and the frequency bins may be predefined. As an example, in some embodiments, the lowest frequency bin may be associated with the lowest frequency band, the second and third lowest frequency bins may be associated with the second lowest frequency band, and so on.

The method 200 then proceeds to step S204 to determine the frequency band energies based on frequency parameters of the associated frequency bin(s). As discussed above, in some embodiments, each frequency bin may be represented as a complex, the real part and imaginary part of which are frequency parameters corresponding to the frequency bin. In these embodiments, the frequency band energy for the ith frequency band may be determined by calculating the sum of squares of the real and imaginary parts of the frequency bins associated with that frequency band:

$$E_p(i) = \sum_{k=B_{si}}^{B_{ei}} |x_p(k)|^2$$

where $B_{si}$ and $B_{ei}$ represent the first and last frequency bin associated with the ith frequency band, respectively.

It can be seen that in the embodiments discussed above, the frequency band energies are determined merely depending on the frequency parameters of the current frame. In this way, the frequency band energies may be determined with very low computation cost. Alternatively, in order to improve accuracy of the frequency band energies, especially for those audio signals with short duration, the frequency band energies for the current frame may be determined based on the respective frequency parameters of the current frame and at least one previous frame of the audio signal.

More specifically, FIG. 3 shows windowed signals 301 and 302 of a previous frame and the current frame. The windowed signal 302 of the current frame may be shifted by a length of S to obtain a shifted windowed signal 303. By combining the signals 301 and 303, a windowed signal 304 with a longer window is obtained. Mathematically, the signal 304 may derived as follows:

$$x'_p = x_{p-1}(n) + x_p(n-S)$$

where $x_p(n-S)$ represents the convolution of $x_p(n)$ and $\delta(n-S)$, and $\delta()$ represents the shifting function. Then the combined signal can be expressed as:

$$x'_p = x_{p-1}(n) + x_p(n) \otimes \delta(n-S)$$

where $\otimes$ represents the convolution function.

Accordingly, in such embodiments, when processing the pth frame, the time domain samples for both the current frame and a previous frame(s) may be converted into the frequency domain:

$$X_p(k) = F(x'_p) = F(x_{p-1}(n)) + F(x_p(n)) * F(\delta(n-S))$$

In this way, the frequency parameters of both the current and one or more previous frames will be taken into consideration when determining the frequency band energies for the current frame p. As a result, the frequency band energies can be determined more accurately with less noise. Moreover, it would be appreciated that $F(\delta(n-S))$ will be identical for all the frames and can be calculated and stored in advance. Thus, the computation complexity and cost will be low because only some addition and multiplication operations are needed.

Figure 4A:
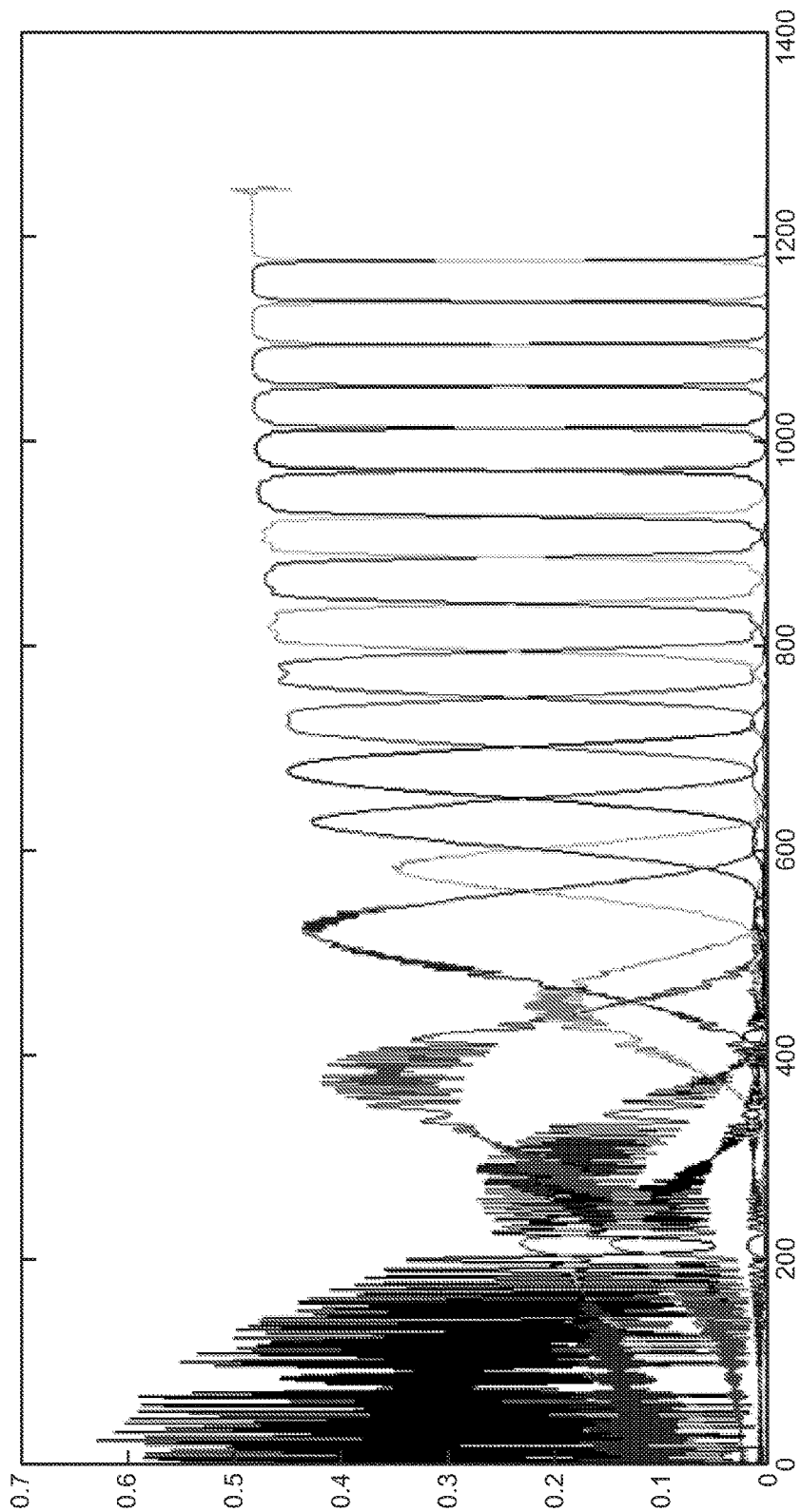

FIGS. 4A-4B show diagrams of the frequency band excitations of a log sweep signal based on MDFT parameters of 288 points and 544 points, respectively. Each curve in the figures corresponds to the excitation of one frequency band. It can be seen that the excitation based on the frequency parameters of 544 points is much more stable than that based on the frequency parameters of 288 points.

Specifically, in the above example embodiment, the frequency parameters of a single previous frame are considered. It should be noted that the scope of the invention is not limited thereto. Instead, in other embodiments, the frequency band energies may be determined based on the frequency parameters of the current frame and any suitable number of previous frames. Moreover, it is found that only the band excitations of several low frequency bands are trend to be noisy and inaccurate. Accordingly, in some embodiments, only the frequency band energies for one or more low frequency bands are determined based on the combined frequency parameters of the current and previous frames. In other words, it is possible to calculate the combined frequency parameters using $F(x'_p)$ only for the lowest one or more frequency bins.

Referring back to FIG. 2, the method 200 then proceeds to step S205. At step S205, the frequency band gains for the predefined frequency bands are generated by processing one or more frequency band energies, for example, according to one or more parameters of the target playback device to therefore improve the presentation and calibration of the audio signal. For example, in some embodiments, equalizer processing may be applied to the frequency band energies. Parameters of the equalizer processing may be determined by different settings including base enhancement, graphics equalizer setting, optimizer setting, and so forth. Alternatively or additionally, the frequency band energies may be input to a regulator. In some embodiments, the regulator may be a multi-band limiter that allows measured per band distortion peak and limit thresholds to be enforced. Each frequency band may be operated independently from the other frequency bands so that particular resonances can be suppressed. Furthermore, a peak limiter may be used to perform peak limiting processing to ensure that the output signal after boosting is within a certain peak limit threshold.

Next, at step S206, the frequency band gains generated at step S205 are converted into the frequency bin gains using predefined frequency band filter banks that are specific to the frequency bands. In general, such filter banks may be considered as a matrix composed of a real part $T^r$ and imaginary part $T^i$, each of which is a complex array of frequency coefficients with the size of N×M×B, where M represents a delay length and B represents the number of frequency bands. In some embodiments, the frequency band filter banks may be designed as follows.

For each frequency band $b \in [0, B-1]$, a desired impulse response $t_b^r(n)$, which is a band-pass filter representing the response of frequency band b, may be constituted. The filter will be finite length which may be defined for $n \in [0, L-1]$, where $L = 2N + (M-2)S - C_0 + 1$. Optionally, for each frequency band $b \in [0, B-1]$, it is also possible to make up a desired impulse response $t_b^i(n)$ which is a band-pass filter representing the 90-degree phase shifted response of frequency band b. This filter will also be finite length defined for $n \in [0, L-1]$.

Then, for each of the band filters $t_b^r(n)$ and possibly $t_b^i(n)$, the long filter may be broken into several shorter chunks denoted as $f_b^i(n,m)$, where $n \in [0, 2N-S-C_0]$ and $m \in [0, M-1]$. For example, in an embodiment where N=320, S=256, M=3 and $C_0$=48, a filter of length $L = 2N + (M-2)S - C_0 + 1 = 849$ may be broken into M=3 chunks, each of length $2N - S - C_0 + 1 = 337$. The chunks will overlap each other by $C_F = 2N - 2S - C_0 + 1 = 81$ samples. Each impulse response chunk is then transformed into the frequency domain $T_b^r(k, m) = F(t_b^r(n,m))$ which can be considered as a frequency domain filter bank specific to the frequency band b. Similarly, $T_b^r(k,m)$ may be constructed. These coefficients then may be used to generate the frequency bin gains in real time.

The frequency band filters as designed above are suitably narrow, with phase response tailored to ensure that the full set of the band filters sums to a flat frequency response. Moreover, the frequency domain coefficients $T^r$ and imaginary part $T^i$ are sparse such that the computation complexity and cost are relatively low. It should be noted that the above example is only for the purpose of illustration. Given a set of predefined frequency bands, the associated frequency band filters may be designed in various manners. The scope of the invention is not limited in this regard.

With the frequency band gains as input, the frequency band filter banks may output corresponding frequency bin gains as follows:

$$F_p(k, m) = \sum_{b=0}^{B-1} T_b^r(k, m)R(g_p(b)) + T_b^i(k, m)I(g_p(b))$$

where $g_p(b)$ represents the frequency band gains for the frequency band b ($0 \leq b \leq B$), and $R()$ and $I()$ represent the functions for obtaining the real part and imaginary part of $g_p(b)$, respectively. In some embodiments where complex frequency band gains are not required, the imaginary part $T^i$ may be omitted.

The method 200 then proceeds to step S207, where frequency domain output for the current frame are generated based on the frequency bin gains obtained at step S206. For example, the frequency domain output may be generated by multiplying the frequency bin gains with the respective frequency bins:

$$Y_p(k) = X_p(k) F_p(k, m)$$

Alternatively, in order to take into consideration the impact of one or more previous frames, in some embodiments, the frequency domain output for the current frame may be generated at step S207 based on the frequency bin gains for not only the current frame but also for at least one previous frame:

$$Y_p(k) = \sum_{m=0}^{M-1} X_{p-m}(k) F_p(k, m)$$

where M represents the number of previous frames taken into account.

In some embodiment, at next step S208, the frequency domain crossfading may be applied to the signal $Y_p(k)$ to obtain the final frequency domain output for the current frame. In this way, it is possible to get more smooth and continuous transition from one frame to another, with minimized clicks or other audible artifacts. Alternatively, the signal $Y_p(k)$ obtained at step S207 may be directly used as the final frequency domain output and step S208 may be omitted.

Then, at step S209, the frequency domain output for the current frame is transformed to the time domain to generate the time domain output for the current frame. Here the frequency-time transform is an inverse transform of the time-frequency transform that is used at step S202. For example, in those embodiments where MDFT functions as the time-frequency transform at step S202, the frequency domain output may be transformed back to the time domain with Inverse Modulated Discrete Fourier Transform (IMDFT):

$$y_p(n) = IMDFT(Y_p(k)) = \frac{1}{n}\sum_{k=0}^{N-1} R(Y_p(k)e^{-i\pi(2k+1)n/2N})$$

The obtained time domain audio signal may be directly played back. Alternatively, it is possible to perform time domain processing at step S210. In some embodiments, the time domain processing may comprise time domain crossfading by adding inter-frame overlaps. As discussed above, if $C_0 > 1$, then the resulting 2N time domain samples for the current frame will overlap partially with the previous frame. Therefore, the time domain output signal may be calculated as:

$$\text{output}_p(pS+n) = \text{output}_{p-1}(pS+n) + y_p(n), \{0 \le n < 2N\}$$

where $\text{output}_p(pS+n)$ represents the S samples output for the current frame p. Additionally or alternatively, the peak limiting processing may be applied to the time domain output signal in order to ensure that the output signal after boosting is below a certain peak limit threshold.

In addition to the device specific audio signal processing as discussed above, in accordance with example embodiments of the present invention, headphone virtualization may be applied to the audio signal. As used herein, the "headphone virtualization" refers to a process for using headphones or earphones to generate virtual loudspeakers such that a listener can experience the sound of virtual loudspeakers over headphones with a level of realism similar to the real loudspeaker experience. Furthermore, the headphone virtualization may optionally involve room equalization, reverberation and/or any other suitable processes. In this way, it is possible to electronically impart to each channel of the audio signal the sonic signature of corresponding speakers (two for stereo programs and up to seven for surround programs) properly placed in a well-defined acoustic environment.

For example, in some example embodiments, the subwoofer signal may be mixed into the left and right channels in equal proportion with the headphone. Accordingly, all the information may be combined into two encoded channels that are delivered to each ear of the listener via a conventional stereo headphone. In this way, it is possible to create up multiple virtual loudspeakers in a virtual room. As a result, the listening sensation is much more natural, with sounds seeming to come from outside the head of the listener.

In order to achieve the headphone virtualization, the input audio signal may be convolved with head-related impulse response (HRIR). For example, in some example embodiments, each channel of the audio signal may be associated with a HRIR. In such embodiments, signal of each channel may be convolved with the associated HRIR for the headphone virtualization.

In some example embodiments, the convolution may be done in the time domain. For example, in the embodiments as shown in FIG. 2, after the time domain crossfading window is applied on the signal samples at step S201, the resulting signal may be convolved with the HRIR. In some example embodiments, the HRIR may be represented by a HRTF (head-related transfer function) filter which is known and will not be detailed here.

In other words, in such embodiments, the headphone virtualization is achieved by means of the time domain convolution prior to the subsequent audio signal processing. As an example, in the method 200 as discussed above, the headphone virtualization may be performed between steps S201 and S202. In some embodiments, before step S201 of the method 200, optional reverberation may be applied to the input signal of each channel, and the audio signal may be framed. After step S201, the framed audio signal may be directly convolved with the HRIR parameters and possibly room equalization parameters. Next, the convolved audio signal may be converted into the frequency domain at step S202 for subsequent audio signal processing.

Alternatively, in some other example embodiments, convolutions for the headphone virtualization may be carried out in the frequency domain, for example, by re-using the predefined frequency band filter banks that are designed specific to the frequency bands. In such embodiments, no HRIR convolution is needed in the time domain. Rather, the HRIR may be integrated into the predefined filter banks in the frequency domain, such that the convolution of HRIR may be carried out without a separate time domain convolution. In other words, while generating the frequency bin gains by processing the frequency band energies using the predefined frequency band filter banks at step S103 or S206, the convolution of the HRIR and the audio signal may be performed to thereby achieve the headphone virtualization.

In some example embodiments, given HRIR parameters, the predefined frequency band filter banks may be modified according to those HRIR parameters. For example, it is possible to modify the frequency band filters by multiplying the frequency domain parameters of the HRIR with the parameters of the predefined frequency band filter banks as discussed above. Alternatively, in some other example embodiments, the HRIR parameters may be integrate into the filter banks by changing the target summation of all the predefined filter banks to the frequency domain parameters of the HRIR when designing the predefined filter banks. As such, by utilizing the redundant lengths of the predefined frequency band filter banks, the efficiency of headphone virtualization may be significantly improved.

Specifically, in those embodiments where the headphone virtualization is implemented in the frequency domain, the frequency band energies generated at step S204 may be modified at least partially based on the HRIR in order to provide more accurate and natural processed audio signal. Optionally, it is also possible to take room equalization parameters into account when modifying the frequency band energies. For example, in some example embodiments, the band energy of each frequency band may be multiply with the gains of the HRIR and/or room equalization associated with that frequency band. Then the modified frequency band energies may be processed at step S205 to generate the frequency band gains for the predefined frequency bands.

Moreover, in some example embodiments, the audio signal may be convolved with the HRIR, either in the time domain or in the frequency domain, based on the symmetry of the channels in order to reduce the computation complexity and cost. It would be appreciated that if the convolutions of HRIR are directly applied on each channel, it is necessary to perform two convolution operations on each channel, one for the left ear and the other for the right ear. By taking the symmetry of the channels into account, the number of convolution operations may be reduced.

Figure 5:
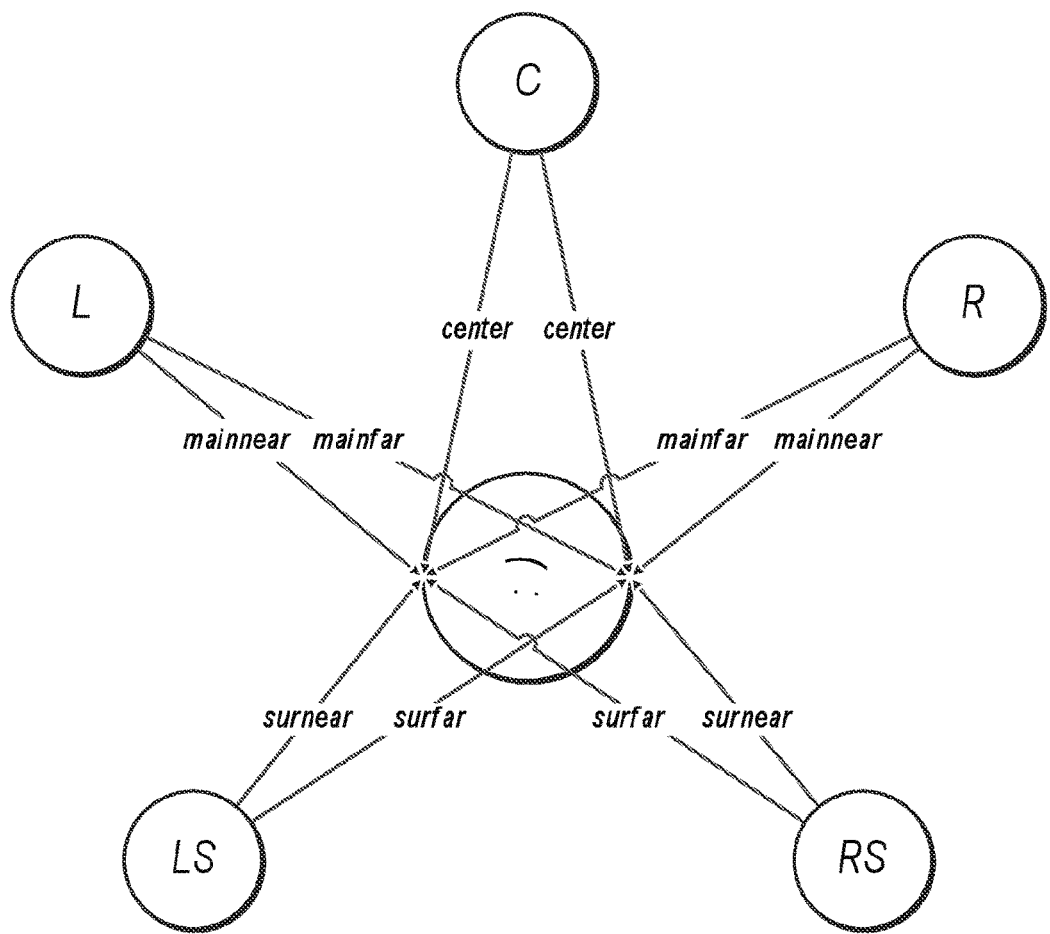
FIG. 5 illustrates a schematic diagram of an example symmetric five-speaker configuration in accordance with example embodiments of the present invention.

Consider the symmetric five-speaker configuration shown in FIG. 5 as an example. As used herein, the term "symmetry" means that the contribution of the left/left surround channel to the left ear is equal to the contribution of the right/right surround channel to the right ear, the contribution of the left/left surround channel to the right ear is equal to the contribution of the right/right surround channel to the left ear, and the contributions of the central channel to the right and left ears are equal. FIG. 5 shows the schematic diagram of the symmetry of channels.

For the sake of discussions, C, L, R, LS and RS are used to represent the audio signals of the center channel, left channel, right channel, left surround channel and right surround channel, respectively. The contributions of the left channel and right channel to the left ear (denoted as $S_{LM}$) may be calculated as follows:

$$S_{LM}=L*\text{mainnear}+R*\text{mainfar}$$

where mainnear represents the HRIR of the left channel with respect to the left ear, mainfar represents the HRIR of the right channel with respect to the left ear, and operator "*" represents the convolution operation. Due to the symmetry of the channels, the contributions of the left channel and right channel to the right ear (denoted as $S_{RM}$) may be calculated as follows:

$$S_{RM}=L*\text{mainfar}+R*\text{mainnear}$$

It can be seen that four convolution operations are required to directly calculate $S_{LM}$ and $S_{RM}$. In order to reduce the number of convolution operations to improve efficiency, some example embodiments may calculate $S_{LM}+S_{RM}$ and $S_{LM}+S_{RM}$, instead of $S_{LM}$ and $S_{RM}$, as follows:

$$S_{LM}+S_{RM}=(L+R)*(\text{mainnear}+\text{mainfar})$$

$$S_{LM}-S_{RM}=(L-R)*(\text{mainnear}-\text{mainfar})$$

As such, only two convolutions are enough. Then $S_{LM}$ and $S_{RM}$ may be recovered from $S_{LM}+S_{RM}$ and $S_{LM}+S_{RM}$ by adding and subtraction operations, thereby reducing the computation complexity and costs.

Likewise, the contributions of the left surround and right surround channels may be recovered from the following terms:

$$S_{LS}+S_{RS}=(LS+RS)*(\text{surnear}+\text{surfar})$$

$$S_{LS}-S_{RS}=(LS-RS)*(\text{surnear}-\text{surfar})$$

where surnear represent the HRIR of the left surround channel with respect to left ear or the HRIR of the right surround channel with respect to the right ear, and surfar represents the HRIR of the left surround channel with respect to right ear or the HRIR of the right surround channel with respect to the left ear. The contribution of the center channel (denoted as $S_c$) may be calculated as:

$$S_c=C*\text{center}$$

where center represents the HRIR of the central channel to the right or left ear.

In this way, only five convolutions are required to determine the sum of the contributions of all channels to the left ear ($S_L$) and right ear ($S_R$). More specifically, $S_L$ and $S_R$ may be calculated as follows:

$$S_L = S_C + \frac{(S_{LM}+S_{RM})+(S_{LM}-S_{RM})}{2} + \frac{(S_{LS}+S_{RS})+(S_{LS}-S_{RS})}{2}$$

$$S_R = S_C + \frac{(S_{LM}+S_{RM})-(S_{LM}-S_{RM})}{2} + \frac{(S_{LS}+S_{RS})-(S_{LS}-S_{RS})}{2}$$

In such example embodiments, the audio signal and HRIR may be converted, respectively, according to the symmetry of the channels. For example, in the example symmetric five-speaker configuration as discussed above, the audio signal may be converted into the signals C, (L+R), (L−R), (LS+RS), and (LS−RS), while the HRIR may be converted into the HRIRs center, (mainnear+mainfar), (mainnear−mainfar), (surnear+surfar), and (surnear−surfar). Accordingly, in those embodiments where the headphone virtualization is carried out in the time domain, the converted audio signals may be directly convolved with the converted HRIRs in the time domain.

On the other hand, in those embodiments where the headphone virtualization is performed in the frequency domain by means of the predefined frequency band filter banks specific to the frequency bands, each of the converted HRIRs center, (mainnear+mainfar), (mainnear−mainfar), (surnear+surfar), and (surnear−surfar) may be convolved with each of the predefined filter banks. Then, the obtained filter banks may be used to achieve the headphone virtualization as well as the device specific audio signal processing. It would be appreciated that in addition to the reduction of computation cost, in the symmetric five-speaker configuration, storage resources may be saved since it is only necessary to pre-store five additional filters for each of the predefined frequency bands.

Figure 6:
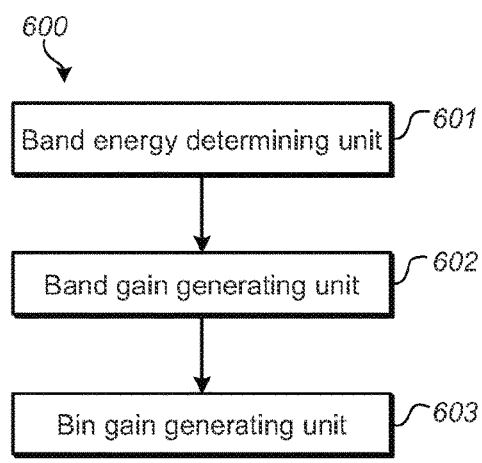
FIG. 6 illustrates a block diagram of a system for processing audio signal in accordance with example embodiments of the present invention.

FIG. 6 shows a block diagram of a system 600 for processing audio signal in accordance with an example embodiment of the present invention. As shown, the system 600 comprises a band energy determining unit 601 configured to determine, for a current frame of the audio signal, frequency band energies for a plurality of predefined frequency bands at least partially based on frequency parameters of the current frame; a band gain generating unit 602 configured to generate frequency band gains for the plurality of predefined frequency bands by processing the frequency band gains; and a bin gain generating unit 603 configured to generate frequency bin gains for the current frame based on the frequency band gains using predefined frequency band filter banks, the frequency band filter banks being specific to the plurality of predefined frequency bands.

In some embodiments, the system 600 may further comprise: a time-frequency transforming unit configured to transform the current frame from time domain to frequency domain to obtain a plurality of frequency bins; and an associating unit configured to associate each of the frequency bands with at least one of the frequency bins. In these embodiments, the band energy determining unit 601 is configured to determine the frequency band energy for each of the frequency bands based on the frequency parameters corresponding to the associated at least one frequency bin.

In some embodiments, the system 600 may further comprise a first time domain crossfading unit configured to apply crossfading to the current frame in the time domain.

In some embodiments, the frequency band energies for one or more of the frequency bands are determined based on the frequency parameters of the current frame and at least one previous frame of the audio signal. Specifically, in some embodiments, the one or more frequency bands include at least one low frequency band among the plurality of predefined frequency bands.

In some embodiments, the band gain generating unit 602 may comprise at least one of: an equalizer, a regulator, and a peak limiter.

In some embodiments, the band gain generating unit 602 may comprise a device specific processing unit configured to generate the frequency band gains by processing the frequency band energies according to a parameter of a playback device for playing back the audio signal.

In some embodiments, the system 600 may further comprise: a frequency domain output generating unit configured to generate frequency domain output for the current frame at least partially based on the frequency bin gains for the current frame. In some embodiments, the frequency domain output generating unit comprises a unit configured to generate the frequency domain output for the current frame based on the frequency bin gains for the current frame and at least one previous frame of the audio signal. In some embodiments, the system 600 may further comprise a frequency domain crossfading unit configured to apply crossfading to the frequency domain output; a frequency-time transforming unit configured to transform the frequency domain output into time domain to generate time domain output for the current frame; a second time domain crossfading unit configured to apply crossfading to the generated time domain output; and a peak limiting unit configured to limit the time domain output with a predefined peak threshold.

In some embodiments, the system 600 may further comprises a headphone virtualization unit configured to apply headphone virtualization to the audio signal by convolving the audio signal with head-related impulse response (HRIR) associated with the audio signal.

In some embodiments, the headphone virtualization unit may comprise a time domain convolving unit configured to convolve the audio signal with the HRIR in time domain.

Alternatively or additionally, in some embodiments, the HRIR may be integrated into the predefined frequency band filter banks. In such embodiments, for example, the headphone virtualization unit may comprise a frequency domain convolving unit configured to convolve the audio signal with the HRIR in frequency domain using the predefined frequency band filter banks. Specifically, in some embodiments, the system 600 may further comprise a band energy modifying unit configured to modify the determined frequency band energies at least partially based on the HRIR.

In some embodiments, the system 600 may further comprise at least one of: a room equalizing unit configured to apply room equalization to the audio signal; and a reverberating unit configured to apply reverberation to the audio signal.

In some embodiments, the audio signal may be convolved with the HRIR based on symmetry of channels of the audio signal. Specifically, in some embodiments, the headphone virtualization unit may comprise an audio signal converting unit and a HRIR converting unit. The audio signal converting unit may be configured to convert the audio signal according to the symmetry of the channels. The HRIR converting unit may be configured to convert the HRIR according to the symmetry of the channels. In such embodiments, the headphone virtualization unit may be configured to convolve the converted audio signal and the converted HRIR.

For the sake of clarity, some optional components of the system 600 are not shown in FIG. 6. However, it should be appreciated that the features as described above with reference to FIGS. 1-2 are all applicable to the system 600. Moreover, the components of the system 600 may be a hardware module or a software unit module. For example, in some embodiments, the system 600 may be implemented partially or completely with software and/or firmware, for example, implemented as a computer program product embodied in a computer readable medium. Alternatively or additionally, the system 600 may be implemented partially or completely based on hardware, for example, as an integrated circuit (IC), an application-specific integrated circuit (ASIC), a system on chip (SOC), a field programmable gate array (FPGA), and so forth. The scope of the present invention is not limited in this regard.

Figure 7:
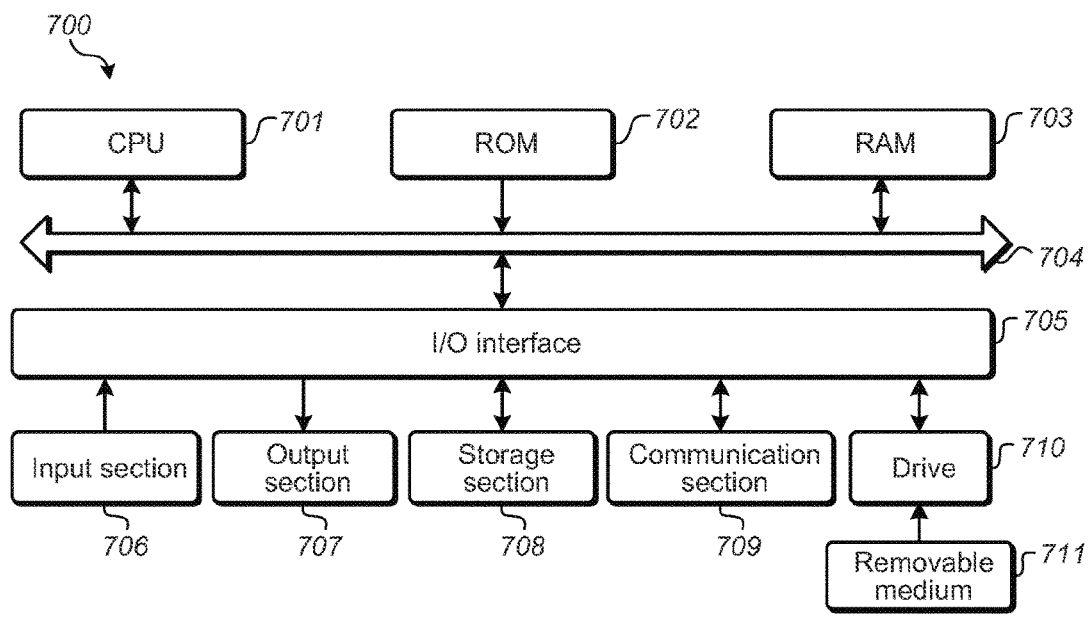
FIG. 7 illustrates a block diagram of an example computer system suitable for implementing embodiments of the present invention.

Referring to FIG. 7, a block diagram of an example computer system 700 suitable for implementing embodiments of the present invention is shown. As shown, the computer system 700 comprises a central processing unit (CPU) 701 which is capable of performing various processes in accordance with a program stored in a read only memory (ROM) 702 or a program loaded from a storage section 708 to a random access memory (RAM) 703. In the RAM 703, data required when the CPU 701 performs the various processes or the like is also stored as required. The CPU 701, the ROM 702 and the RAM 703 are connected to one another via a bus 704. An input/output (I/O) interface 705 is also connected to the bus 704.

The following components are connected to the I/O interface 705: an input section 706 including a keyboard, a mouse, or the like; an output section 707 including a display such as a cathode ray tube (CRT), a liquid crystal display (LCD), or the like, and a loudspeaker or the like; the storage section 708 including a hard disk or the like; and a communication section 709 including a network interface card such as a LAN card, a modem, or the like. The communication section 709 performs a communication process via the network such as the internet. A drive 710 is also connected to the I/O interface 705 as required. A removable medium 711, such as a magnetic disk, an optical disk, a magneto-optical disk, a semiconductor memory, or the like, is mounted on the drive 710 as required, so that a computer program read therefrom is installed into the storage section 708 as required.

Specifically, in accordance with embodiments of the present invention, the processes described above with reference to FIGS. 1-2 may be implemented as computer software programs. For example, embodiments of the present invention comprise a computer program product including a computer program tangibly embodied on a machine readable medium, the computer program including program code for performing method 100 and/or method 200. In such embodiments, the computer program may be downloaded and mounted from the network via the communication unit 709, and/or installed from the removable memory unit 711.

Generally speaking, various example embodiments of the present invention may be implemented in hardware or special purpose circuits, software, logic or any combination thereof. Some aspects may be implemented in hardware, while other aspects may be implemented in firmware or software which may be executed by a controller, microprocessor or other computing device. While various aspects of the example embodiments of the present invention are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

Additionally, various blocks shown in the flowcharts may be viewed as method steps, and/or as operations that result from operation of computer program code, and/or as a plurality of coupled logic circuit elements constructed to carry out the associated function(s). For example, embodiments of the present invention include a computer program product comprising a computer program tangibly embodied on a machine readable medium, the computer program containing program codes configured to carry out the methods as described above.

In the context of the disclosure, a machine readable medium may be any tangible medium that can contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Computer program code for carrying out methods of the present invention may be written in any combination of one or more programming languages. These computer program codes may be provided to a processor of a general purpose computer, special purpose computer, or other programmable data processing apparatus, such that the program codes, when executed by the processor of the computer or other programmable data processing apparatus, cause the functions/operations specified in the flowcharts and/or block diagrams to be implemented. The program code may execute entirely on a computer, partly on the computer, as a stand-alone software package, partly on the computer and partly on a remote computer or entirely on the remote computer or server.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Various modifications, adaptations to the foregoing example embodiments of this invention may become apparent to those skilled in the relevant arts in view of the foregoing description, when read in conjunction with the accompanying drawings. Any and all modifications will still fall within the scope of the non-limiting and example embodiments of this invention. Furthermore, other embodiments of the inventions set forth herein will come to mind to one skilled in the art to which these embodiments of the invention pertain having the benefit of the teachings presented in the foregoing descriptions and the drawings.

The present invention may be embodied in any of the forms described herein.

For example, the following enumerated example embodiments (EEEs) describe some structures, features, and functionalities of some aspects of the present invention.

EEE 1. A method for headphone virtualization, comprising applying headphone virtualization to audio signal by convolving the audio signal with head-related impulse response (HRIR) associated with the audio signal.

EEE 2. The method according to EEE 1, wherein the convolving is performed in time domain.

EEE 3. The method according to EEE 1, wherein the convolving is performed in frequency domain.

EEE 4. The method according to EEE 3, wherein the HRIR is integrated into predefined frequency band filter banks that are designed specific to a plurality of predefined frequency bands of the audio signal, and wherein the convolving comprises convolving the audio signal with the HRIR in the frequency domain using the predefined frequency band filter banks.

EEE 5. The method according to EEE 3, further comprising modifying, at least partially based on the HRIR, frequency band energies for a plurality of predefined frequency bands of the audio signal in the frequency domain.

EEE 6. The method according to EEE5, wherein the modifying comprises multiplying the band energy of each of the frequency bands by gains of the HRIR and/or room equalization associated with that frequency band.

EEE 7. The method according to any of EEEs 1 to 6, further comprising applying at least one of room equalization and reverberation to the audio signal.

EEE 8. The method according to EEE 7, wherein the room equalization is applied by convolution or by directly modifying frequency band gains for a plurality of predefined frequency bands of the audio signal.

EEE 9. The method according to EEEs 1 to 8, wherein the audio signal is convolved with the HRIR based on symmetry of channels of the audio signal.

EEE 10. The method according to EEE 9, wherein the convolving comprises: converting the audio signal according to the symmetry of the channels; converting the HRIR according to the symmetry of the channels; and convolving the converted audio signal and the converted HRIR.

EEE 11. A system comprising units configured to perform the method according to any of EEEs 1 to 10.

It will be appreciated that the embodiments of the invention are not to be limited to the specific embodiments disclosed and that modifications and other embodiments are intended to be included within the scope of the appended claims. Although specific terms are used herein, they are used in a generic and descriptive sense only and not for purposes of limitation.

The invention claimed is:

1. A method for processing audio signal, the method comprising:
    determining, for a current frame of the audio signal, frequency band energies for a plurality of predefined frequency bands at least partially based on frequency parameters of the current frame;
    generating frequency band gains for the plurality of predefined frequency bands by processing the frequency band energies;
    generating frequency bin gains for the current frame based on the frequency band gains using predefined frequency band filter banks, the frequency band filter banks being specific to the plurality of predefined frequency bands; and
    applying headphone virtualization to the audio signal by convolving the audio signal with a head-related impulse response (HRIR) associated with the audio signal,
    wherein the HRIR is integrated into the predefined frequency band filter banks, and wherein the convolving comprises:
    convolving the audio signal with the HRIR in a frequency domain using the predefined frequency band filter banks.

2. The method according to claim 1, wherein determining the frequency band energies comprises:
    transforming the current frame from a time domain to the frequency domain to obtain a plurality of frequency bins;
    associating each of the frequency bands with at least one of the frequency bins; and
    determining the frequency band energy for each of the frequency bands based on the frequency parameters corresponding to the associated at least one frequency bin.

3. The method according to claim 2, wherein transforming the current frame comprises applying time domain crossfading to the current frame.

4. The method according to claim 1, wherein the frequency band energies for one or more of the frequency bands are determined based on the respective frequency parameters of the current frame and at least one previous frame of the audio signal.

5. The method according to claim 4, wherein the one or more frequency bands include at least one low frequency band among the plurality of predefined frequency bands.

6. The method according to claim 1, wherein generating the frequency band gains comprises applying at least one of the following on the frequency band energies: equalizer processing, regulator processing, and peak limiting processing.

7. The method according to claim 1, wherein the frequency band gains are generated by processing the frequency band energies according to a parameter of a playback device for playing back the audio signal.

8. The method according to claim 1, further comprising:
    generating frequency domain output for the current frame at least partially based on the frequency bin gains for the current frame.

9. The method according to claim 8, wherein the frequency domain output for the current frame is generated based on the respective frequency bin gains for the current frame and at least one previous frame of the audio signal.

10. The method according to claim 8, further comprising:
    applying frequency domain crossfading to the frequency domain output;
    transforming the frequency domain output into a time domain to generate time domain output for the current frame;
    applying time domain crossfading to the generated time domain output; and
    limiting the time domain output with a predefined peak threshold.

11. The method according to claim 10, wherein the convolving comprises:
    convolving the audio signal with the HRIR in the time domain.

12. The method according to claim 11, further comprising:
    modifying the determined frequency band energies at least partially based on the HRIR.

13. The method according to claim 10, further comprising:
    applying at least one of room equalization and reverberation to the audio signal.

14. The method according to claim 10, wherein the audio signal is convolved with the HRIR based on a symmetry of channels of the audio signal.

15. The method according to claim 14, wherein the convolving comprises:
    converting the audio signal according to the symmetry of the channels;
    converting the HRIR according to the symmetry of the channels; and
    convolving the converted audio signal and the converted HRIR.

16. A system for processing audio signal, the system comprising:
    a band energy determining unit configured to determine, for a current frame of the audio signal, frequency band energies for a plurality of predefined frequency bands at least partially based on frequency parameters of the current frame;

a band gain generating unit configured to generate frequency band gains for the plurality of predefined frequency bands by processing the frequency band energies;

a bin gain generating unit configured to generate frequency bin gains for the current frame based on the frequency band gains using predefined frequency band filter banks, the frequency band filter banks being specific to the plurality of predefined frequency bands; and a headphone virtualization unit configured to apply headphone virtualization to the audio signal by convolving the audio signal with a head-related impulse response (HRIR) associated with the audio signal, wherein the HRIR is integrated into the predefined frequency band filter banks, and wherein the convolving comprises: convolving the audio signal with the HRIR in a frequency domain using the predefined frequency band filter banks.

17. The system according to claim 16, further comprising:
a time-frequency transforming unit configured to transform the current frame from a time domain to the frequency domain to obtain a plurality of frequency bins; and an associating unit configured to associate each of the frequency bands with at least one of the frequency bins, wherein the band energy determining unit is configured to determine the frequency band energy for each of the frequency bands based on the frequency parameters corresponding to the associated at least one frequency bin.

18. The system according to claim 17, further comprising:
a first time domain crossfading unit configured to apply time domain crossfading to the current frame.

19. The system according to claim 16, wherein the frequency band energies for one or more of the frequency bands are determined based on the respective frequency parameters of the current frame and at least one previous frame of the audio signal.

20. The system according to claim 19, wherein the one or more frequency bands include at least one low frequency band among the plurality of predefined frequency bands.

21. The system according to claim 16, wherein the band gain generating unit comprises at least one of: an equalizer, a regulator, and a peak limiter.

22. The system according to claim 16, wherein the band gain generating unit comprises a device specific processing unit configured to generate the frequency band gains by processing the frequency band energies according to a parameter of a playback device for playing back the audio signal.

23. The system according to claim 16, further comprising:
a frequency domain output generating unit configured to generate frequency domain output for the current frame at least partially based on the frequency bin gains for the current frame.

24. The system according to claim 23, wherein the frequency domain output generating unit comprises a unit configured to generate the frequency domain output for the current frame based on the respective frequency bin gains for the current frame and at least one previous frame of the audio signal.

25. The system according to claim 23, further comprising:
a frequency domain crossfading unit configured to apply frequency domain crossfading to the frequency domain output;

a frequency-time transforming unit configured to transform the frequency domain output into a time domain to generate time domain output for the current frame;

a second time domain crossfading unit configured to apply time domain crossfading to the generated time domain output; and a peak limiting unit configured to limit the time domain output with a predefined peak threshold.

26. The system according to claim 25, wherein the headphone virtualization unit comprises:
a time domain convolving unit configured to convolve the audio signal with the HRIR in the time domain.

27. The system according to claim 16, further comprising:
a band energy modifying unit configured to modify the determined frequency band energies at least partially based on the HRIR.

28. The system according to claim 25, further comprising at least one of:
a room equalizing unit configured to apply room equalization to the audio signal; and a reverberating unit configured to apply reverberation to the audio signal.

29. The system according to claim 25, wherein the audio signal is convolved with the HRIR based on symmetry of channels of the audio signal.

30. The system according to claim 29, wherein the headphone virtualization unit comprises:
an audio signal converting unit configured to convert the audio signal according to the symmetry of the channels; and a HRIR converting unit configured to convert the HRIR according to the symmetry of the channels, wherein the headphone virtualization unit is configured to convolve the converted audio signal and the converted HRIR.

31. A computer program product for processing audio signal, the computer program product being tangibly stored on a non-transient computer readable medium and comprising machine executable instructions which, when executed, cause the machine to perform steps of the method according to claim 1.

* * * * *